(12) United States Patent
Ooka

(10) Patent No.: US 9,685,639 B2
(45) Date of Patent: Jun. 20, 2017

(54) ORGANIC EL DISPLAY DEVICE AND METHOD FOR MANUFACTURING THE SAME

(71) Applicant: Japan Display Inc., Tokyo (JP)

(72) Inventor: Hiroshi Ooka, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/939,628

(22) Filed: Nov. 12, 2015

(65) Prior Publication Data

US 2016/0141340 A1    May 19, 2016

(30) Foreign Application Priority Data

Nov. 14, 2014 (JP) ................. 2014-232131

(51) Int. Cl.
| | | |
|---|---|---|
| *H01L 27/32* | (2006.01) | |
| *H01L 51/56* | (2006.01) | |
| *H01L 51/52* | (2006.01) | |

(52) U.S. Cl.
CPC .......... *H01L 51/56* (2013.01); *H01L 51/5234* (2013.01); *H01L 51/5253* (2013.01); *H01L 27/3225* (2013.01); *H01L 27/3246* (2013.01); *H01L 51/524* (2013.01); *H01L 51/5218* (2013.01); *H01L 2227/323* (2013.01); *H01L 2251/558* (2013.01)

(58) Field of Classification Search
CPC ..... H01L 27/32; H01L 51/56; H01L 27/3246; H01L 27/2348; H01L 27/3262; H01L 51/5234; H01L 51/5218
See application file for complete search history.

(56) References Cited

U.S. PATENT DOCUMENTS

| | | | | |
|---|---|---|---|---|
| 2015/0069340 A1* | 3/2015 | Min | ...................... | H05K 3/4638 257/40 |
| 2016/0149152 A1* | 5/2016 | Kim | ................... | H01L 51/0072 257/40 |

FOREIGN PATENT DOCUMENTS

JP    2007-088127 A    5/2007

* cited by examiner

*Primary Examiner* — Phuc Dang
(74) *Attorney, Agent, or Firm* — Typha IP LLC

(57) ABSTRACT

An organic EL display device includes a display area, a measurement area provided outside the display area, an organic layer that is formed in the display area and in the measurement area and includes a light-emitting layer, and a conductive film that is formed on the organic layer in the display area and functions as the upper electrode. The conductive film covers the organic layer in the measurement area.

8 Claims, 6 Drawing Sheets

ORGANIC EL DISPLAY DEVICE AND METHOD FOR MANUFACTURING THE SAME

CROSS-REFERENCE TO RELATED APPLICATION

The present application claims priority from Japanese application JP2014-232131 filed on Nov. 14, 2014, the content of which is hereby incorporated by reference into this application.

BACKGROUND OF THE INVENTION

1. Field of the Invention

The present invention relates to an organic EL display device and a method for manufacturing the device.

2. Description of the Related Art

In organic electroluminescent (EL) display devices, the thickness of an organic layer including a light-emitting layer affects its light-emitting performance such as light intensity. Thus, the thickness needs to be managed with high accuracy. JP 2007-88127 A discloses an organic semiconductor device in which an area used to measure the thickness of an organic film (hereinafter, simply "measurement area"), is provided outside its display area. Organic layers are formed in both the display area and the measurement area, and the thickness of the organic layer formed in the measurement area is measured. As a method for measuring the thickness, it is typical to irradiate the measurement area with light and analyze reflected light (e.g., reflection spectroscopy and spectroscopic ellipsometry).

Moisture deteriorates organic layers. Thus, in many organic EL display devices, organic layers formed in their display area are covered with a sealing film to keep out moisture. However, if the organic layer in the measurement area is covered with a sealing film, which is usually several times to several tens of times as thick as an organic layer, the sealing film affects measurement of the thickness of the organic layer and makes it difficult to measure the thickness with high accuracy. In this regard, if the sealing film in the measurement area is removed, moisture may enter the organic layer and affect measurement of the thickness.

SUMMARY OF THE INVENTION

It is an object of the present invention to provide an organic EL display device that allows for highly accurate measurement of the thickness of its organic layer and to provide a method for manufacturing the device.

(1) In view of the above problem, an organic EL display device according to the present invention includes a display area, a measurement area provided outside the display area, an organic layer that is formed in the display area and in the measurement area and includes a light-emitting layer, and a conductive film that is formed on the organic layer in the display area and functions as an upper electrode. The conductive film covers the organic layer in the measurement area.

(2) In an aspect of the organic EL display device according to the present invention, the item (1) may further include a sealing film covering the organic layer and the conductive film in the display area and covering neither the organic layer nor conductive film in the measurement area.

(3) In an aspect of the organic EL display device according to the present invention, in any of the items (1) and (2), a reflective film may be formed under the organic layer in the display area and under the organic layer in the measurement area.

(4) In an aspect of the organic EL display device according to the present invention, the item (3) may further include a planarization film formed under the reflective film.

(5) In an aspect of the organic EL display device according to the present invention, any of the items (1) and (2) may further include an underlayer that is formed under the organic layer in the measurement area and has an opening in it. The organic layer may be stacked in the opening.

(6) In view of the above problem, a method for manufacturing an organic EL display device according to the present invention includes the following steps. A substrate having a display area and a measurement area provided outside the display area is prepared. An organic layer including a light-emitting layer is formed in the display area and in the measurement area. A conductive film is formed on the organic layer in the display area and on the organic layer in the measurement area.

(7) In an aspect of the method for manufacturing the organic EL display device according to the present invention, the item (6) may further include forming a sealing film disposed on the conductive film in the display area and on the conductive film in the measurement area, and etching the sealing film in the measurement area.

(8) In an aspect of the method for manufacturing the organic EL display device according to the present invention, any of the items (6) and (7) may further include forming a reflective film disposed under the organic layer in the display area and under the organic layer in the measurement area.

(9) In an aspect of the method for manufacturing the organic EL display device according to the present invention, the item (8) may further include forming a planarization film disposed under the reflective film in the display area and under the reflective film in the measurement area.

(10) In an aspect of the method for manufacturing the organic EL display device according to the present invention, any of the items (6) and (7) may further include forming an underlayer in the display area and in the measurement area, and forming an opening in the underlayer in the measurement area.

DETAILED DESCRIPTION OF THE INVENTION

Some organic EL display devices according to embodiments of the present invention are described below with reference to the accompanying drawings.

[First Embodiment]

An organic EL display device according to a first embodiment has a plurality of pixels arranged in a matrix as display control objects. In each of the pixels, an organic electroluminescent element is disposed. The organic electroluminescent element in each pixel includes an organic layer having a light-emitting layer. The plurality of pixels are arranged in the display area of the organic EL display device. In the peripheral area around the display area, a data line driver circuit and a scan line driver circuit are disposed. The data line driver circuit and the scan line driver circuit input signals to each of the pixels to drive the pixels.

A first substrate having the organic electroluminescent elements on it includes a plurality of scan lines. The scan lines are evenly spaced from each other. In addition, for example, a plurality of power lines that supply power to the organic electroluminescent elements and a plurality of data lines are evenly spaced from each other in the direction substantially perpendicular to the scan lines.

Figure 1:
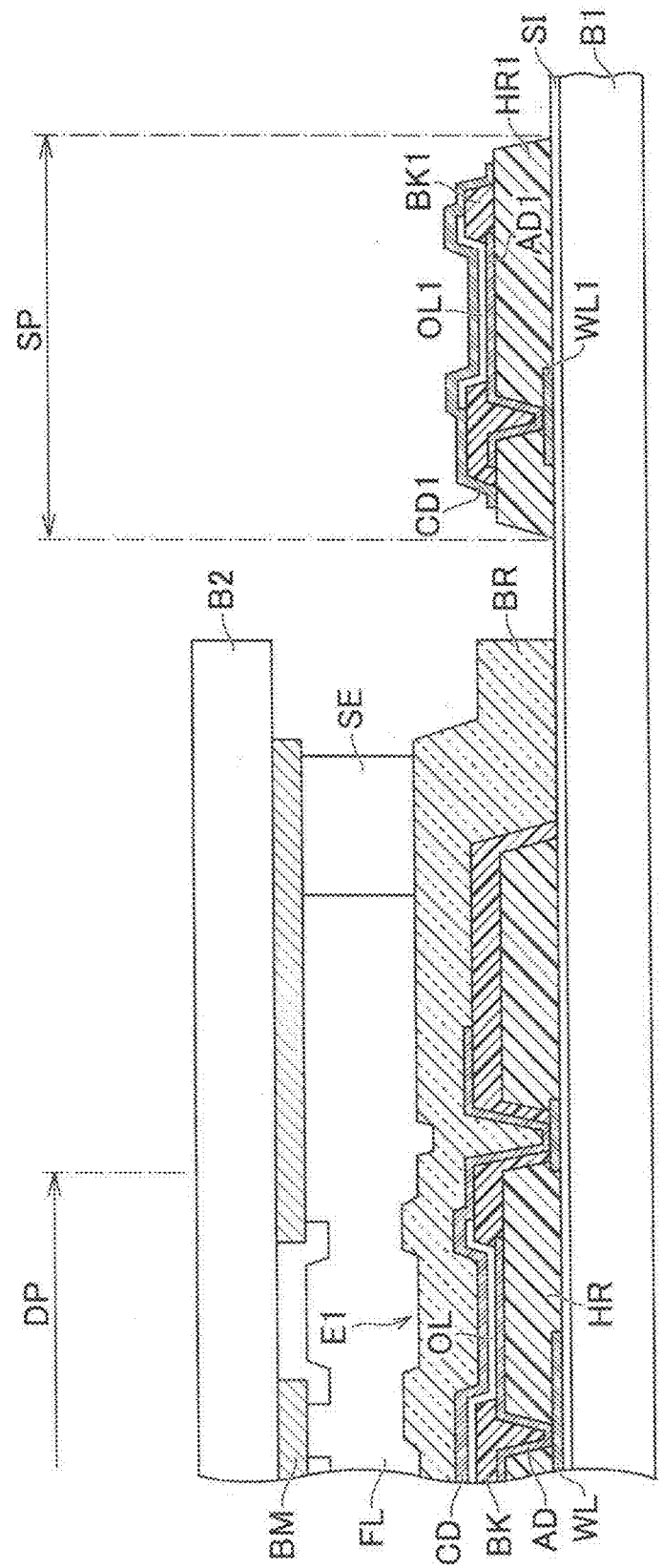
FIG. 1 is a schematic cross-sectional view of an organic EL display device according to a first embodiment.

FIG. 1 is a schematic cross-sectional view of the organic EL display device in this embodiment, for explaining the configurations of a display area DP and a measurement area SP. The organic EL display device in this embodiment includes a first substrate B1, a second substrate B2 disposed to face the first substrate B1, and a filler FL filling the gap between the first substrate B1 and the second substrate B2. The measurement area SP is disposed on part of the first substrate B1 where the first substrate B1 is exposed through one edge of the second substrate B2. The following describes the structure of each part of the display area DP first, and then describes the measurement area SP.

In each pixel on the first substrate B1, an organic electroluminescent element E1 is disposed. The organic electroluminescent element E1 includes a lower electrode AD, an upper electrode CD, and an organic layer OL sandwiched between these electrodes. The upper electrode CD is disposed to cover the organic layer OL and functions as the cathode electrode (cathode) common to the plurality of pixels. The lower electrode AD is the anode electrode (anode) disposed individually in each pixel and coupled to a wiring layer WL. The lower electrode AD supplies, to the organic layer OL, a current corresponding to a signal input to the data line.

The structure under the organic electroluminescent elements E1 is planarized by a planarization film HR made of an organic insulating film. The planarization film HR planarizes lines disposed under the organic electroluminescent elements E1 and steps due to thin film transistors. The current supplied to the organic layer OL is controlled by signals input to these lines and the thin film transistors. The organic layer OL in this embodiment is formed by stacking a hole transport layer, a light-emitting layer, and an electron transport layer from below. When holes injected from the lower electrode AD and electrons injected from the upper electrode CD recombine, the light-emitting layer in the organic layer OL emits light.

In this embodiment, the upper electrode CD is a transmissive metal thin film made from metal such as indium zinc oxide (IZO) or indium tin oxide (ITO). The lower electrode AD includes a reflective layer made of a highly reflective metal, such as aluminum, and a transparent layer, such as ITO.

As shown in FIG. 1, the display area for displaying images are partitioned into the pixels by an inter-pixel insulating film BK made of an organic insulating film. The inter-pixel insulating film BK covers the outer edge of the lower electrode AD disposed individually in each pixel to separate adjacent lower electrodes AD from each other.

As shown in FIG. 1, the display area, where the organic electroluminescent elements E1 are disposed, is covered with a sealing film BR to protect the organic layers OL and other components, for example, from moisture. This sealing film BR is formed to be stacked under the second substrate B2 by depositing a silicon nitride film (SiNx) or a silicon oxide film (SiOx) on the entire surface of the first substrate B1 (mother glass substrate) by a CVD process and then removing the film by etching using the second substrate B2 as a mask.

The second substrate B2 in this embodiment is a color filter substrate including color layers. A light-blocking layer BM is disposed along the outer edge of the display area DP and between the pixels. The second substrate B2 is fixed to the first substrate B1 with a sealant SE.

In particular, a pattern for measurement of the organic layer OL is disposed in the measurement area SP. This pattern for measurement is formed simultaneously in at least part of a process, which is shared with formation of the pattern, for manufacturing the organic electroluminescent elements E1. On the topside of an organic layer OL1 for measurement, the same conductive film CD1 as the upper electrode CD is disposed to cover the organic layer OL1. The measurement area SP has no sealing film BR, and thus allows for highly accurate measurement of the thickness of the organic layer OL1. This conductive film CD1 is made of a material unreactive with an etching gas for etching the sealing film BR and protects the organic layer OL1 for measurement. Additionally, the conductive film CD1 prevents moisture from entering the organic layer OL1 between removing the sealing film BR and measuring the thickness of the organic layer OL1. The sealing film BR is several times to several tens of times as thick as the organic layer OL1, whereas the upper electrode CD (conductive film CD1) is thinner than the sealing film BR. Thus, the conductive film CD1 can prevent deterioration of the organic layer OL1 and allows for highly accurate measurement of the thickness of the organic layer OL1.

The organic layer OL1 in the measurement area SP in this embodiment is disposed over a planarization layer HR1, which is formed in the same step as the planarization film HR in the display area DP. The outer edge of the organic layer OL1 is covered by an insulating layer BK1 formed of the same material as that of the inter-pixel insulating film BK. The organic layer OL1 in the measurement area SP is coupled to a wiring layer WL1 for inspection via the same conductive layer AD1 as the lower electrodes AD. The wiring layer WL1 in this embodiment is formed on an underlayer SI. The underlayer SI is a film formed in contact with the first substrate B1 and protects the semiconductor of the thin film transistors from contamination by impurities that can come from the first substrate B1. For example, the underlayer SI is a film formed of an insulator including a silicon nitride layer.

An inspection signal input from the wiring layer WL1 for inspection causes a current between the conductive layer AD1 and the conductive film CD1 and activates the organic layer OL1 to emit light. Thus, whether the organic layer OL1 (organic layer OL) emits light of sufficient intensity and chromaticity can be inspected. The insulating layer BK1 formed of the same material as that of the inter-pixel insulating film BK prevents a short circuit between the conductive layer AD1 and the conductive film CD1. The wiring layer WL1 does not necessarily have to be this way.

Figure 2:
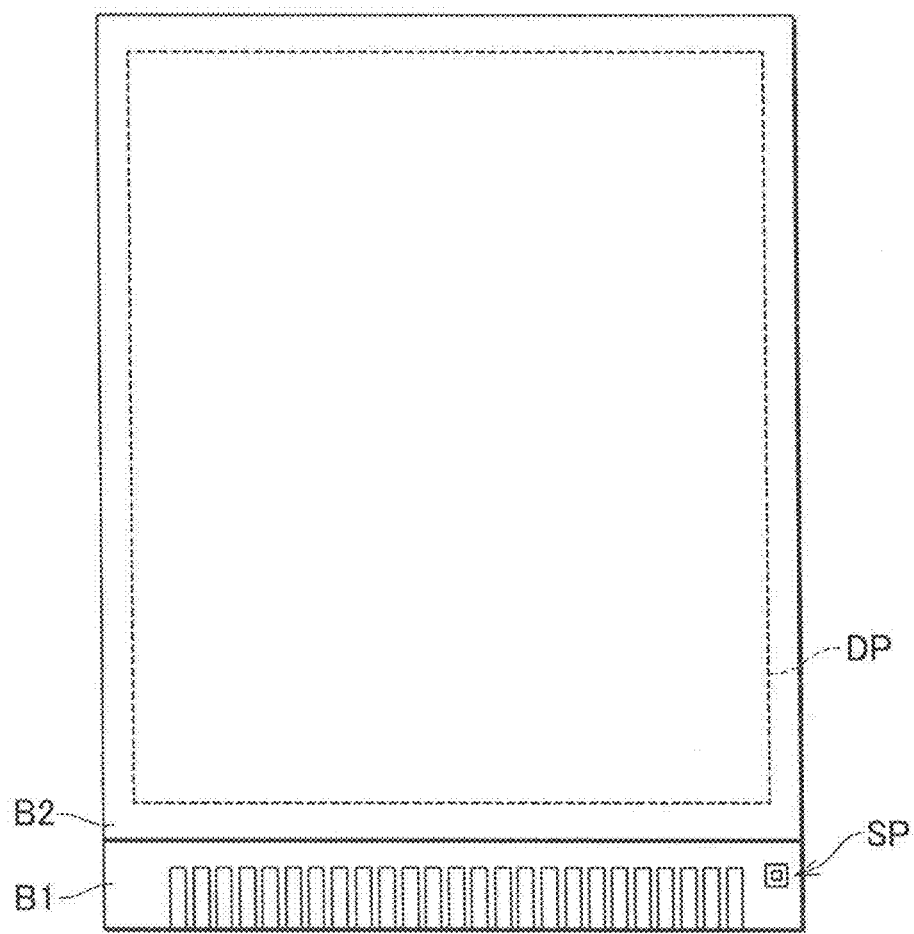
FIG. 2 is a plan view of a measurement area of the organic EL display device in the first embodiment.

FIG. 2 is a plan view of the measurement area SP in this embodiment. FIG. 2 shows the display area DP, in which the pixels are arranged, within the dashed line and the peripheral area around the display area DP. As shown in the figure, a terminal area and the measurement area SP are disposed in part of the peripheral area where the first substrate B1 is exposed through one edge of the second substrate B2. The measurement area SP becomes exposed, in the same manner as the terminal area, by removing the sealing film BR. The measurement area SP is larger than one pixel in which the organic layer OL1 is disposed.

In this embodiment, the conductive layer AD1 formed in the same manner as the lower electrodes AD includes a reflective film, and the measurement area SP is inspected by reflection spectroscopy or spectroscopic ellipsometry for analyzing light reflected from the reflective film. The reflective film, which is disposed under the organic layer OL1 in the measurement area SP, prevents the planarization film HR and the underlayer SI from affecting the measurement of the thickness of the organic layer OL1. In addition, the conductive film CD1, which is formed in the same manner as the upper electrode CD and is exposed in the measurement area SP, and the reflective film included in the conductive layer AD1 produces a micro-resonance effect and allows for evaluation of its performance.

Figure 3:
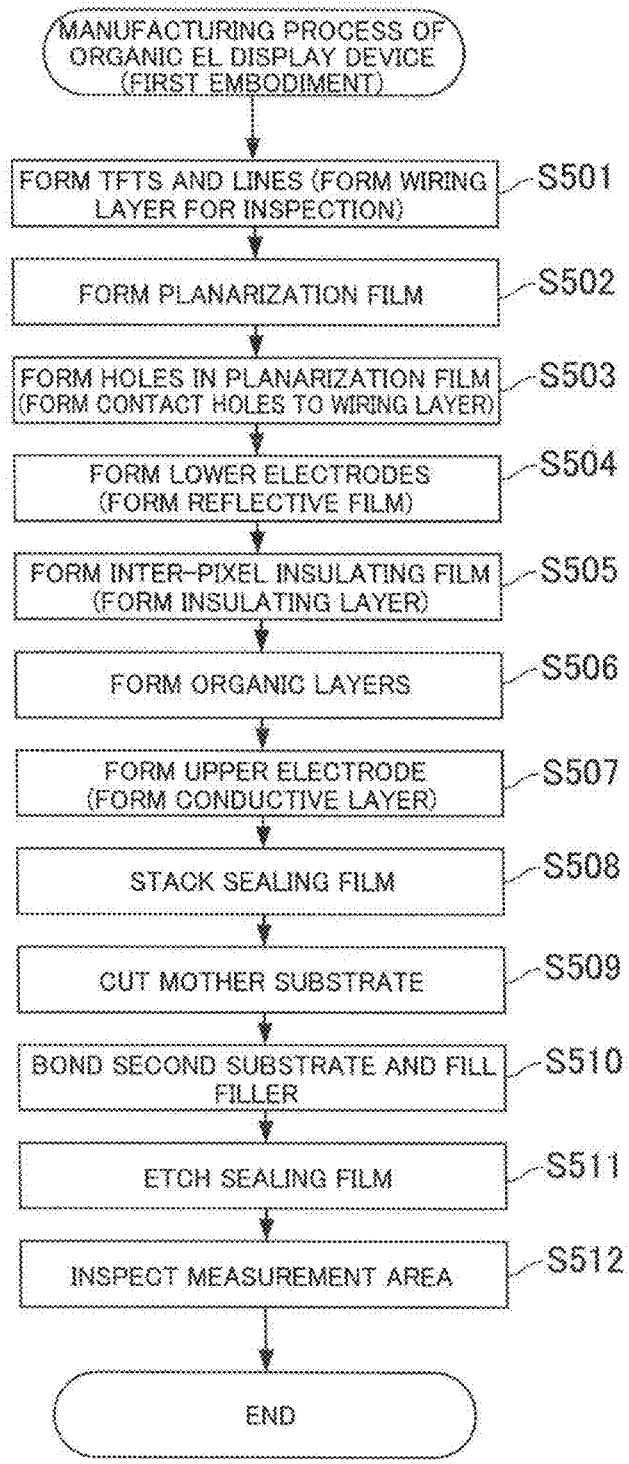
FIG. 3 is a flowchart of a manufacturing process of the organic EL display device in the first embodiment.

The following describes a manufacturing process of the organic EL display device in this embodiment with reference to FIG. 3.

As shown in FIG. 3, in the manufacturing process of the organic EL display device in this embodiment, the thin film transistors in the display area DP and the lines, such as the scan lines, are formed (Step S501). In this Step S501, the wiring layer WL1 for inspection is also formed. In this embodiment, the wiring layer WL1 is formed in contact with the bottom of the planarization film HR.

After Step S501, the planarization film HR is formed in the display area DP and the measurement area SP (Step S502). The shape of the planarization film HR is processed by applying an organic insulating material on the first substrate B1 and by photolithography and etching. Contact holes for coupling the lower electrodes AD and the wiring layer WL, and a contact hole for coupling the conductive layer AD1 and the wiring layer WL1 for inspection are formed in the planarization film HR (Step S503). Then, the lower electrodes AD and the conductive layer AD1 are formed (Step S504). The conductive layer AD1 is formed of the same material as that of the lower electrodes AD in the same step as the lower electrodes AD. The conductive layer AD1 may include, for example, a transparent conductive film as well as the reflective film and be coupled to, for example, the wiring layer WL via this transparent conductive film.

In Step S505, the inter-pixel insulating film BK and the insulating layer BK1 are formed. The inter-pixel insulating film BK in this embodiment is formed of an organic insulating film and its shape is processed, for example, by photolithography. Subsequently, the layers constituting the organic layers OL and the organic layer OL1 are stacked in Step S506, the upper electrode CD and the conductive film CD1 are formed, and then the sealing film BR is stacked by CVD (Steps S506 to S508). The conductive film CD1 is formed of the same material as that of the upper electrode CD in the same step as the upper electrode CD, and its shape is processed, for example, by photolithography.

After the sealing film BR is stacked, the mother substrate is cut into individual display panels (Step S509), and subsequent steps are performed for each of the display panels.

In Step S510, the sealant SE is formed in a dam-like shape around the display area DP, and the filler FL is filled inside the sealant SE when the second substrate B2 is bonded. After that, part of the sealing film BR, which is exposed through one edge of the bonded second substrate B2, is removed by etching using the second substrate B2 as a mask (Step S511). The process then proceeds to a step of inspecting the thickness of the organic layer OL1 and inspecting light intensity and chromaticity (Step S512). The thickness of the organic layer OL1 between the conductive film CD1 and the conductive layer AD1 is inspected for each of all the separate display panels.

[Second Embodiment]

Figure 4:
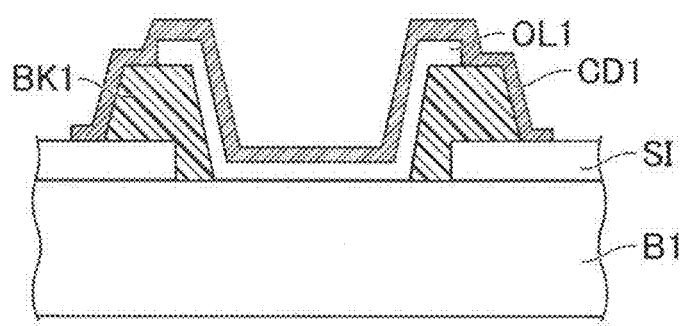
FIG. 4 is a schematic cross-sectional view of a measurement area of an organic EL display device in a second embodiment.

The following describes an organic EL display device according to a second embodiment of the present invention. FIG. 4 is a diagram showing the configuration of a pattern for measurement of the organic layer OL formed in the measurement area SP in the second embodiment.

As shown in FIG. 4, in the pattern for measurement in the second embodiment, an opening is formed in the underlayer SI, and the organic layer OL1 is stacked in the opening. The insulating layer BK1, which is stacked in the same step as the inter-pixel insulating film BK, stacked on the edge of the opening in the underlayer SI. The organic layer OL1 rides on the insulating layer BK1 formed in a bank-like shape. The conductive film CD1, which is stacked in the same step as the upper electrode CD, is stacked on the organic layer OL1. The insulating layer BK1, which is formed on the edge of the opening, can prevent the underlayer SI from peeling off from the first substrate B1. In the second embodiment, neither the planarization film HR nor the reflective film is formed in the measurement area SP.

The organic layer OL1 is stacked in the opening, where the underlayer SI is removed. Thus, the thickness of the organic layer OL1 can be measured with high accuracy because reflection from the underlayer SI, which can adversely affect the measurement, is eliminated.

Figure 5:
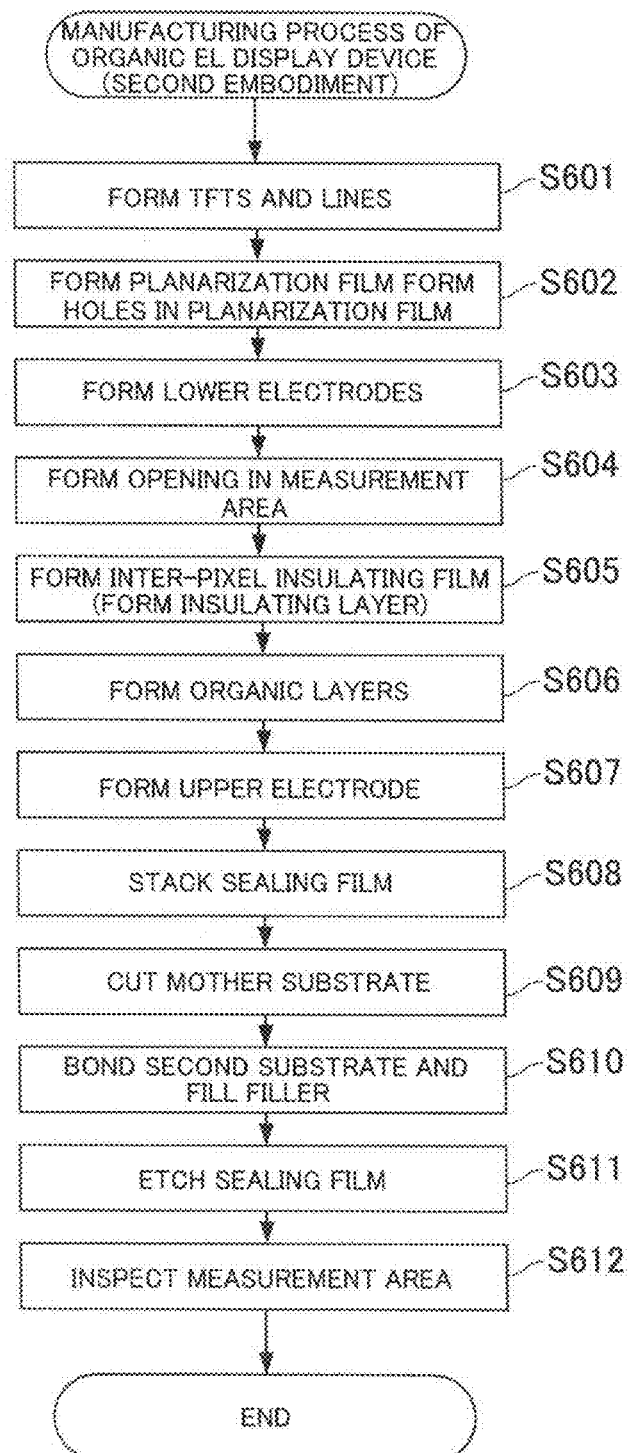
FIG. 5 is a flowchart of a manufacturing process of the organic EL display device in the second embodiment.

FIG. 5 is a flowchart of a manufacturing process of the organic EL display device in the second embodiment. First, the thin film transistors in the display area DP and the lines, such as the scan lines, are formed on the underlayer SI (Step S601). Subsequently, the planarization film HR is formed, holes are formed in the planarization film HR, and the lower electrodes AD are formed (Steps S602 to S603). In the second embodiment, the planarization film HR is removed from the measurement area SP.

In Step S604, the opening is formed in the measurement area SP by photolithography and etching. In the second embodiment, the step of forming the opening in the underlayer SI is provided independently from the other steps. After that, in Step S605, the inter-pixel insulating film BK is formed in the display area DP, and the insulating layer BK1 is also formed in the opening in the measurement area SP. In Step S606, the organic layer OL is formed in the display area DP, and the organic layer OL1 is also formed in the measurement area SP. In Step S607, the upper electrode CD is formed in the display area DP, and the conductive film CD1 is formed in the measurement area SP. The conductive film CD1, which covers the organic layer OL1, prevents moisture from entering the organic layer OL1 in the measurement area SP.

Step S608 and subsequent steps are the same as those in the first embodiment. After the sealing film BR is stacked, the mother substrate is cut into the first substrates B1, and the second substrate B2 is bonded to each first substrate so that the filler FL is sandwiched between the first and second substrates (Steps S608 to S610). Part of the sealing film BR in the area that has the measurement area SP and the terminal area therein and is exposed through one edge of the second substrate B2 is removed by etching, and a step of inspecting the measurement area SP is performed (Steps S611 to S612).

Figure 6:
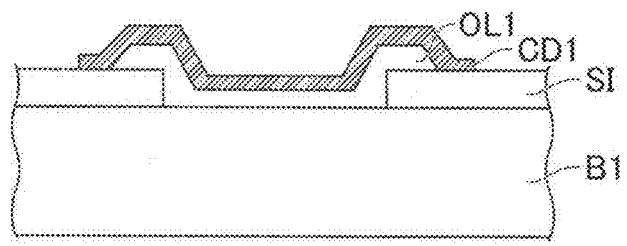
FIG. 6 is a schematic cross-sectional view of a measurement area of an organic EL display device in a modification of the second embodiment.

FIG. 6 is a diagram showing the configuration of a pattern for measurement according to a modification of the second embodiment. As shown in the diagram, the pattern for measurement in this modification differs from the pattern for measurement shown in FIG. 4 in that the insulating layer BK1 is absent, but the other components are essentially the same as those of the pattern for measurement shown in FIG. 4.

The opening in the underlayer SI of the pattern for measurement in the second embodiment may be formed, for example, in the step of forming the TFTs and the lines (S601) or in an order different from that in the flowchart shown in FIG. 5.

Although the organic EL display devices in the above embodiments is top-emitting devices, the present invention can also be applied to bottom-emitting organic EL display devices.

The configurations of the upper electrode CD (conductive film CD1) and the lower electrodes AD (conductive layer AD1) are not limited to the above configurations. For example, the transparent conductive film may be absent in each lower electrode AD.

The present invention is not limited to the pixel structures in the above embodiments. For example, a metal layer and an inorganic insulating layer for forming an auxiliary capacitor may be disposed under each lower electrode AD.

In the organic EL display device in each of the above embodiments, the second substrate B2 is a color filter substrate and the organic layer OL in each pixel emits white light. However, the organic EL display device is not necessarily limited to this configuration. Alternatively, the second substrate B2 may include no color layers, and light of RGB or RGBW may be generated in each pixel.

In the organic EL display device in each of the above embodiments, the sealing film BR made of silicon nitride, which is several times to several tens of times as thick as the organic layer OL, protects the organic layer OL in each pixel. However, the present invention is not necessarily limited to this configuration, and can also be applied to organic EL display devices without such a sealing film as the sealing film BR.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An organic EL display device comprising:
    a display area;
    a measurement area outside the display area;
    an organic layer in the display area and in the measurement area, the organic layer including a light-emitting layer;
    a conductive film, on the organic layer in the display area, for functioning as an upper electrode, the conductive film covering the organic layer in the measurement area; and
    a sealing film covering the organic layer and the conductive film in the display area and covering neither the organic layer nor conductive film in the measurement area.

2. The organic EL display device according to claim 1, wherein
    a reflective film is formed under the organic layer in the display area and under the organic layer in the measurement area.

3. The organic EL display device according to claim 2, further comprising
    a planarization film under the reflective film.

4. An organic EL display device comprising:
    a display area;
    a measurement area outside the display area;
    an organic layer in the display area and in the measurement area, the organic layer including a light-emitting layer;
    a conductive film, on the organic layer in the display area, for functioning as an upper electrode, the conductive film covering the organic layer in the measurement area; and
    an underlayer under the organic layer in the measurement area, the underlayer having an opening therein, the organic layer being stacked in the opening.

5. A method for manufacturing an organic EL display device comprising:
    preparing a substrate having a display area and a measurement area outside the display area;
    forming an organic layer in the display area and in the measurement area, the organic layer including a light-emitting layer;
    forming a conductive film on the organic layer in the display area and on the organic layer in the measurement area;
    forming a sealing film disposed on the conductive film in the display area and on the conductive film in the measurement area; and
    etching the sealing film in the measurement area.

6. The method according to claim 5, further comprising
    forming a reflective film disposed under the organic layer in the display area and under the organic layer in the measurement area.

7. The method according to claim 6, further comprising
    forming a planarization film disposed under the reflective film in the display area and under the reflective film in the measurement area.

8. The method according to claim 5, further comprising:
    forming an underlayer in the display area and in the measurement area; and
    forming an opening in the underlayer in the measurement area.

* * * * *